US007644334B2

(12) United States Patent
Hickman et al.

(10) Patent No.: US 7,644,334 B2
(45) Date of Patent: Jan. 5, 2010

(54) REQUIREMENTS-BASED TEST GENERATION

(75) Inventors: Stephen O. Hickman, Eagan, MN (US); Devesh Bhatt, Maple Grove, MN (US)

(73) Assignee: Honeywell International, Inc., Morristown, NJ (US)

( * ) Notice: Subject to any disclaimer, the term of this patent is extended or adjusted under 35 U.S.C. 154(b) by 178 days.

(21) Appl. No.: 11/945,021

(22) Filed: Nov. 26, 2007

(65) Prior Publication Data
US 2008/0126902 A1 May 29, 2008

Related U.S. Application Data

(60) Provisional application No. 60/861,121, filed on Nov. 27, 2006.

(51) Int. Cl.
*G01R 31/28* (2006.01)
(52) U.S. Cl. .................................. 714/741; 714/739
(58) Field of Classification Search ............... 703/1; 717/11; 714/124, 724, 738, 741, 739
See application file for complete search history.

(56) References Cited

U.S. PATENT DOCUMENTS

| 5,729,554 | A | * | 3/1998 | Weir et al. .................. 714/739 |
| 5,913,023 | A | * | 6/1999 | Szermer ....................... 714/38 |
| 7,272,752 | B2 | * | 9/2007 | Farchi et al. ................... 714/38 |
| 7,457,729 | B2 | * | 11/2008 | Khoche et al. ................. 703/1 |
| 2005/0223295 | A1 | | 10/2005 | Hermes et al. ................ 714/38 |
| 2006/0155520 | A1 | * | 7/2006 | O'Neill et al. ................ 703/11 |
| 2007/0288899 | A1 | * | 12/2007 | Fanning et al. .............. 717/124 |

OTHER PUBLICATIONS

International Search Report for PCT/US2007/085555 dated Aug. 7, 2008.
Bhatt D., et al. "Model-Based Development and the Implications to Design Assurance and Certification" Digital Avionics Systems Conference, 2005. dasc 2005. The 24th Washington, DC, USA 30-03 Oct. 2005, Piscataway, NJ, USA, IEEE, vol. 2, Oct. 30, 2005.
Neema S., et al. "Signal Processing Platform: A Tool Chain for Designing High Performance Signal Processing Applications" Southeastcon, 2005. Proceedings IEEE FT. Lauderdale, Florida, USA Apr. 8-10, 2005, Piscataway, NJ, USA, IEEE, pp. 302-307, XP010789744.

\* cited by examiner

*Primary Examiner*—David Ton
(74) *Attorney, Agent, or Firm*—Fogg & Powers LLC

(57) ABSTRACT

This test generator takes data flow block diagrams and uses requirements-based templates, selective signal propagation, and range comparison and intersection to generate test cases containing test vectors for those diagrams. The templates are based on the functionality and characteristics of a block type, and each block type has associated templates. These templates provide maps for the creation of test values that verify the functionality of particular instances of that block type. Signal propagation allows the generation of diagram-level test cases that verify particular characteristics of a single embedded block. The methods disclosed for signal propagation utilize range intersection, equivalence classes, and block type formulae to create efficient and complete test cases. This test generation method would preferably be repeated until all blocks in a data flow block diagram were verified in their respective contexts, and it creates test cases that cover multiple time steps.

20 Claims, 6 Drawing Sheets

| Execute Count | BLOCK INPUTS/ OUTPUTS | | | Description |
|---|---|---|---|---|
| | Confirm | TimeLimit | Timeout | |
| 55 — 1 | 0 | OpRange .mid | 0 | Reset Timer |
| 56 — (TimeLimit)(Rate) - 1 | 1 | OpRange .mid | 0 | 1 Time Step Before |
| 57 — 1 | 1 | OpRange .mid | 1 | Timer Expires |
| 58 — 1 | 1 | OpRange .mid | 1 | 1 Time Step After |

REQUIREMENTS-BASED TEST GENERATION

PRIORITY

This application claims priority to and incorporates by reference the entirety of U.S. Provisional Application No. 60/861,121, "Requirements-Based Test Generation Using Signal Propagation and Range Intersection," filed on Nov. 27, 2006.

BACKGROUND OF THE INVENTION

Description of the Problem

Verification of algorithm implementations is extremely costly, particularly for aerospace applications that need to be certified. Most of the verification efforts and costs are in testing a software implementation against its design specifications; by automating this verification process, the test generator described herein can substantially reduce the cost and cycle time of system development and certification. This automated test generation is possible due to the widespread industry practice of capturing the software design as a model (data flow block diagram) using tools such as Matlab. The DO-178B certification standard used by the FAA is one example of an industry requirement that implemented code comport with the design specification and low-level requirements embodied in the corresponding model. The current commercial off the shelf tools and techniques for generating tests using these models achieve structural code coverage only and fall considerably short of testing such objectives.

BRIEF SUMMARY OF THE INVENTION

In general, the present invention relates to verification using models for systems that will eventually be implemented in some combination of software and hardware, such as those used for aviation. The objective is to verify that the implementation complies with the model, using test cases created from information in the model. This test generation method facilitates meeting DO-178B objectives by generating tests at several levels of design. A test driver, or test harness, may use these test cases to verify the software and requirements embodied in the model and, in so doing, may achieve structural code coverage. Because application developers currently use costly inspection procedures and manual test generation to meet DO-178B objectives, this automation of the process can dramatically reduce the time and resources needed for verification.

The method operates on a data flow diagram that models a system function. A static analysis phase determines if the diagram contains any static errors; typically, static errors—such as design errors and untestable conditions—render any further test generation futile, and a developer would generally be prompted to fix these errors before further processing occurs. Dynamic analysis creates a series of test vectors that methodically test the functional requirements of each block of the data flow diagram in context. To test the code completely, the method designates one block at a time as the block under test. Using a template associated with the block type of the block under test, the method creates a set of block-level input and outputs that test the functional requirements of the block under test. Signal propagation specifications temporarily represent all of the other blocks in the diagram, and these specifications allow the translation of the block-level inputs and outputs into diagram-level inputs and outputs, respectively. The diagram-level inputs and outputs constitute test vectors, and test cases are built from time-sequencing test vectors. Though the method can call for user intervention if an error is found, it can also proceed through the entire test generation process automatically such that the developer need not manually generate any test cases in order to verify the implemented code against the model.

The test generator uses requirements-based test-case templates, selective signal propagation, and range intersection to create test cases that completely verify a data flow block diagram and its implementation.

BRIEF DESCRIPTION OF THE DRAWINGS

Embodiments of the invention are described below in conjunction with the appended figures, wherein.

DETAILED DESCRIPTION OF THE INVENTION

This invention relates to the development and verification of systems designed using models and to be implemented in a combination of software and hardware. It should be understood that variations in form and detail may be made to the invention without deviating from the spirit and scope of the invention.

Figure 1:
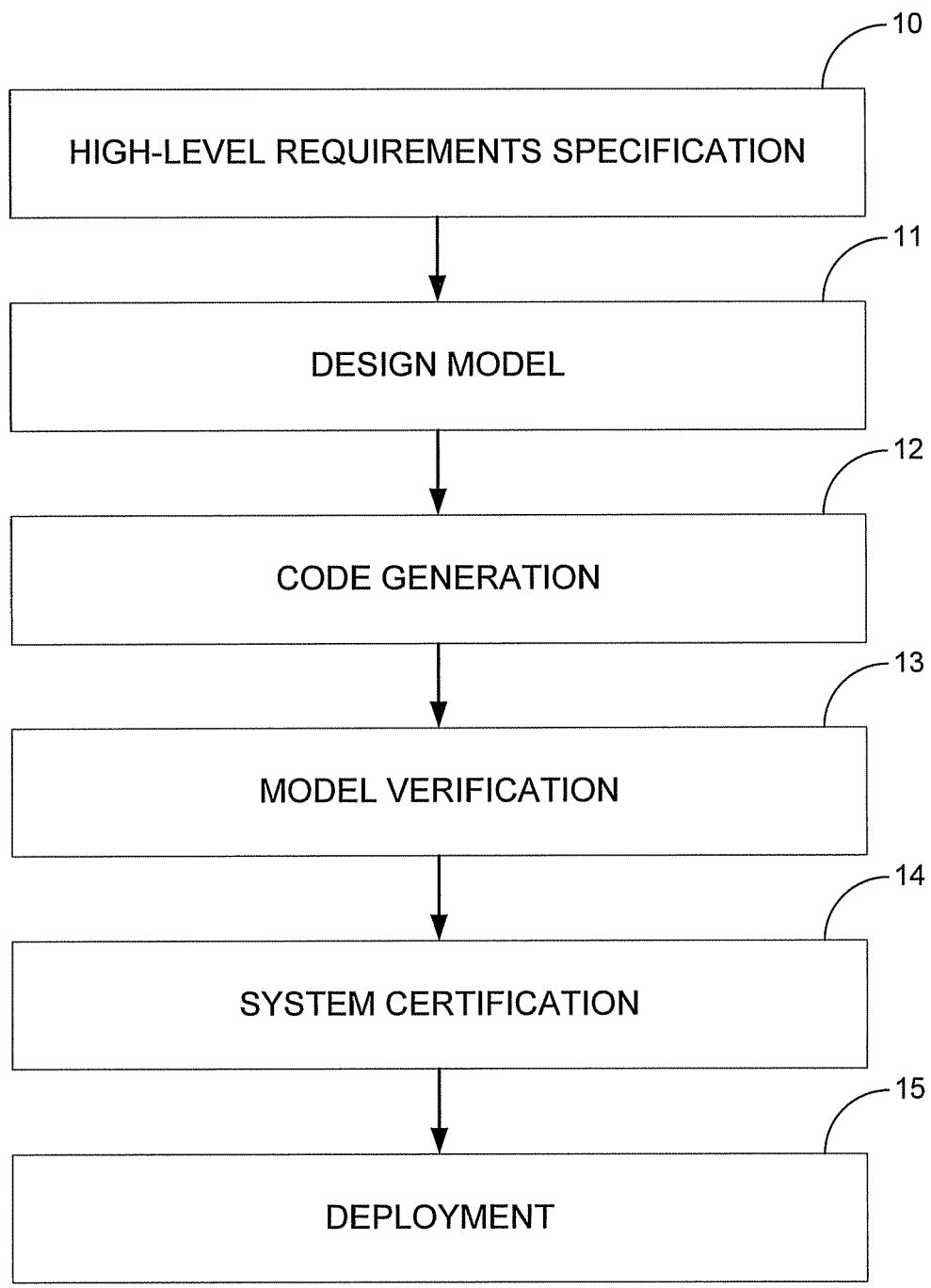
FIG. 1 depicts the system development process.

Implementation verification is one aspect of the overall development process for systems. As an example, FIG. 1 generally charts the development process of control systems. In step 10, a developer identifies a problem such as the need for a particular type of navigation control system and specifies high-level functional requirements for solving the problem. The developer correspondingly proceeds with the design of a system model in step 11, probably in collaboration with a team of developers. The result of step 11 is likely to be a functional model of a system that solves the problem specified in step 10.

In step 12, code may be generated from the model, either manually by the developer or automatically by some computer program capable of realizing the model. The model is verified in step 13, usually according to industry standard objectives like the FAA-mandated DO-178B standard for aviation control systems. Due to the rigor of the certification objectives, step 13 tends to be disproportionately expensive, both in time and in system resources. Because existing test generation programs do not generate a complete set of test cases, developers are forced to manually generate test cases that prove the model conforms to its requirements, as per the DO-178B standard. Only after complete system testing has been achieved can the system be certified in step 14. Finally, in step 15, a certified system can be deployed in industry; for instance, a navigation control system could be incorporated into the avionics of an aircraft.

Data flow block diagrams are commonly used to model specific algorithms for parts of a control system such as flight controls, engine controls, and navigation systems. These algorithms must be designed to execute repeatedly, over one or more time steps, during the operational life of a system.

The purpose of test case generation is to verify that the object code (or other implementation of the data flow block diagram, alternately termed a data flow diagram) correctly implements the algorithm specified by the block diagram.

According to the present invention, the test generation method processes data flow block diagrams by creating test cases for blocks in the diagram. The purpose of the test cases is to test the unique characteristics of each block in situ in the data flow diagram by applying input values to the diagram (rather than applying values to the block in isolation) and measuring expected output values of the diagram.

Figure 2:
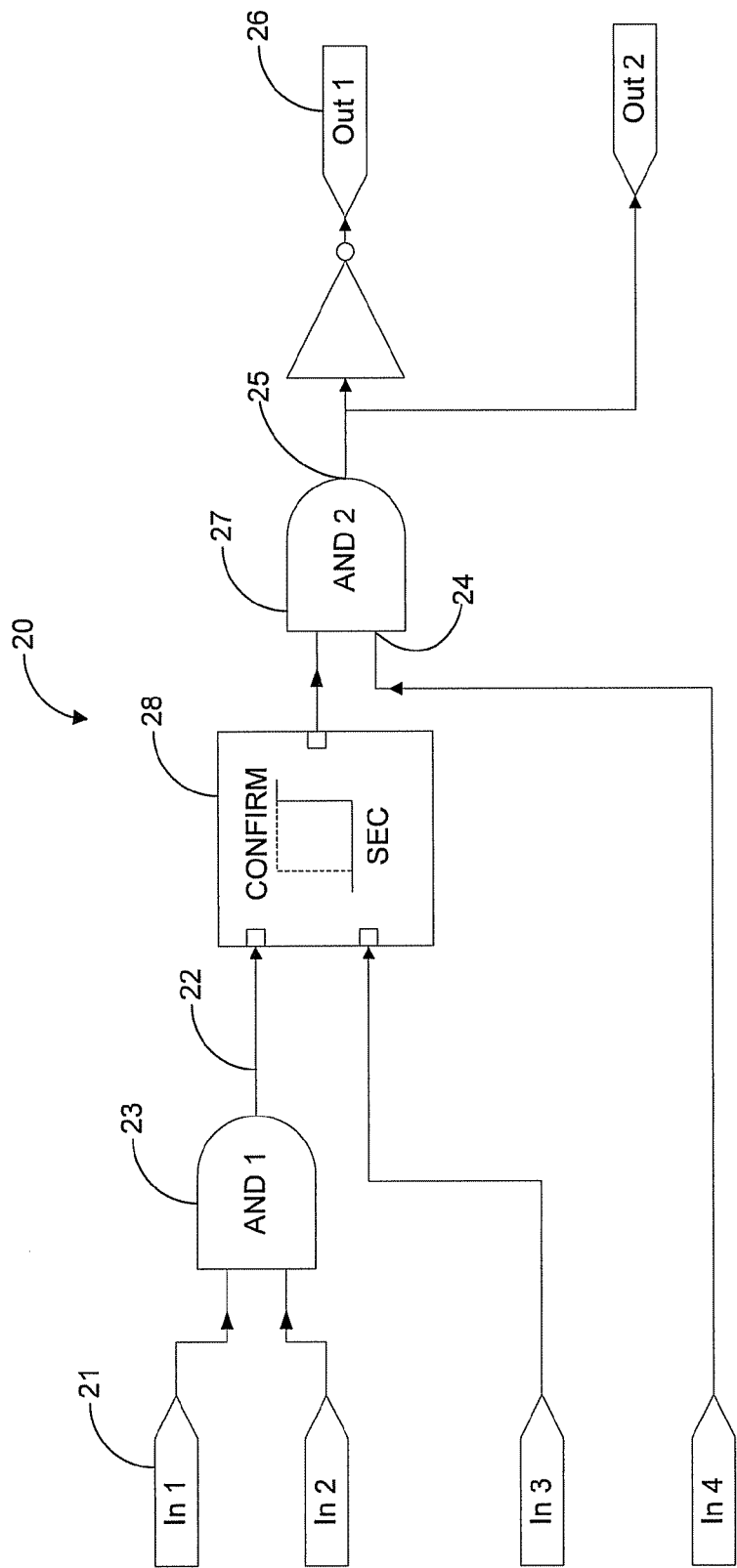
FIG. 2 is an exemplary data flow diagram.

A data flow block diagram is a directed, possibly cyclic, diagram where each node in the diagram performs some type of function, and the arcs connecting nodes indicate how data flow from one node to another. A sample data flow block diagram 20 is shown in FIG. 2. A node of the data flow diagram is also called a block (the two terms are used interchangeably herein), and each block has a block type.

Nodes may have multiple incoming arcs and multiple outgoing arcs. Each end of an arc is connected to a node via a port. Ports are unidirectional—information either flows in or out of a port, but not both. An input port, such as port 24, may have at most one incoming arc, but there is no limit on the outgoing arcs that can emanate from an output port, such as port 25. Nodes like block 21 that have no incoming arcs are considered input blocks and represent diagram-level inputs. Nodes like block 26 that have no outgoing arcs are considered output blocks and represent diagram-level outputs. The blocks can be represented by icons of various shapes to visually denote the specific function performed by a block. Typically, each block type has an industry-standard icon.

The block type defines specific characteristics, including functionality, that are shared by the blocks of that block type. Examples of block type include filter, timer, sum, product, range limit, AND, and OR. (Herein, to avoid confusion, logical functions such as AND and OR are referred to using all capital letters.) A particular block is an instance of that particular block's block type. Block type may dictate quantity, or type and range characteristics, of the input and output ports of blocks of that block type. For example, block 23, labeled AND 1, is an AND gate—the two inputs to block 23, In 1 and In 2, are logically combined to produce output along arc 22. Block 27, labeled AND 2, is also an AND gate, and therefore it has the same block type as block 23.

Block types may be defined at arbitrary levels of functionality and complexity, depending upon the algorithms being implemented. For example, AND, sum, and product are primitive block types, whereas block 28 in FIG. 2 (labeled CONFIRM SEC) has a more complex "timer" block type. Other complex block types include first and second order filters, transient suppressors, integrators, rate limiters, and debouncers. Moreover, block types can be hierarchical; for example, a block may contain a subdiagram implementation involving other blocks. However, the detail of such a subdiagram may be ignored for the purposes of test generation so as to create tests using an independent interpretation of a block's functional requirements that abstracts away any primitive sub-blocks. That independent interpretation could be tied to the block type.

Each port has a maximum-allowable and a normal-operating range. The maximum-allowable range is the maximum range of values that can appear on the port, limited by the implementation of data types and the algorithm constraints of the diagram. The normal-operating range is the normally expected range of values possible on a port when the block diagram implementation is used in a specific system context. Actual operating ranges can exceed normal operating ranges when the system exhibits abnormal behavior; however, the maximum-allowable range bounds the actual operating range. These ranges may be derived from user input, block type, system dictionaries, or other sources. Tolerance is the minimum measurable value difference at a port due to numerical (e.g. floating point) errors.

For each block in the diagram, the test generator generates a set of diagram-level test cases for testing the specific functionality of that block with respect to the block's embedding context. These test cases are generated using test case templates associated with a block's block type. A test case consists of a time sequence of test vectors, where each test vector is a set of values to be injected at the diagram's input blocks and expected values to be measured at the diagram's output blocks. The test generator may solicit input from a user, for example to begin the test generation process, and when test generation is complete, the test generator may output the test cases to either a file or on a display screen. Additionally, the generated test cases may be used by a test driver that applies the test vectors to an implementation of the block diagram. The test driver may solicit user input, for example to begin the testing process, and the test driver may output test results to a file or on a display screen. The test driver could be bundled with the test generator, or it could be a separate software application.

In industry, a data flow block diagram is typically created using a tool such as Matlab Simulink or Microsoft Visio and maintained in a file compatible with that drawing tool. The test generator is independent of both the drawing tool and the file format used to capture the data flow block diagram. The preferred embodiment of the test generator is that of Honeywell Integrated Lifecycle Tools & Environment (HiLiTE). HiLiTE can import data flow block diagrams from different sources, including Matlab Simulink. In the HiLiTE embodiment, test case templates may be stored in Microsoft Access database tables, or XML files. Alternative embodiments could support the native formats of other database applications. Signal propagation specifications are created using a combination of parameter values and XML specifications or using standard programming languages such as C#, J#, C++, or Java. These specifications may be dynamically loaded.

As described herein, the test generator could also be implemented within another tool (not HiLiTE), or as a stand alone tool. The test generator also may include a test driver, with many possible implementations of the test driver. In one embodiment that includes a test driver, the test driver is implemented as software written in the C++ programming language. In another possible embodiment, a test driver may apply the generated test vectors to the simulation of the diagram using the original modeling tool to independently verify the interpretation of the block-level functional requirements.

Static Analysis

Figure 3:
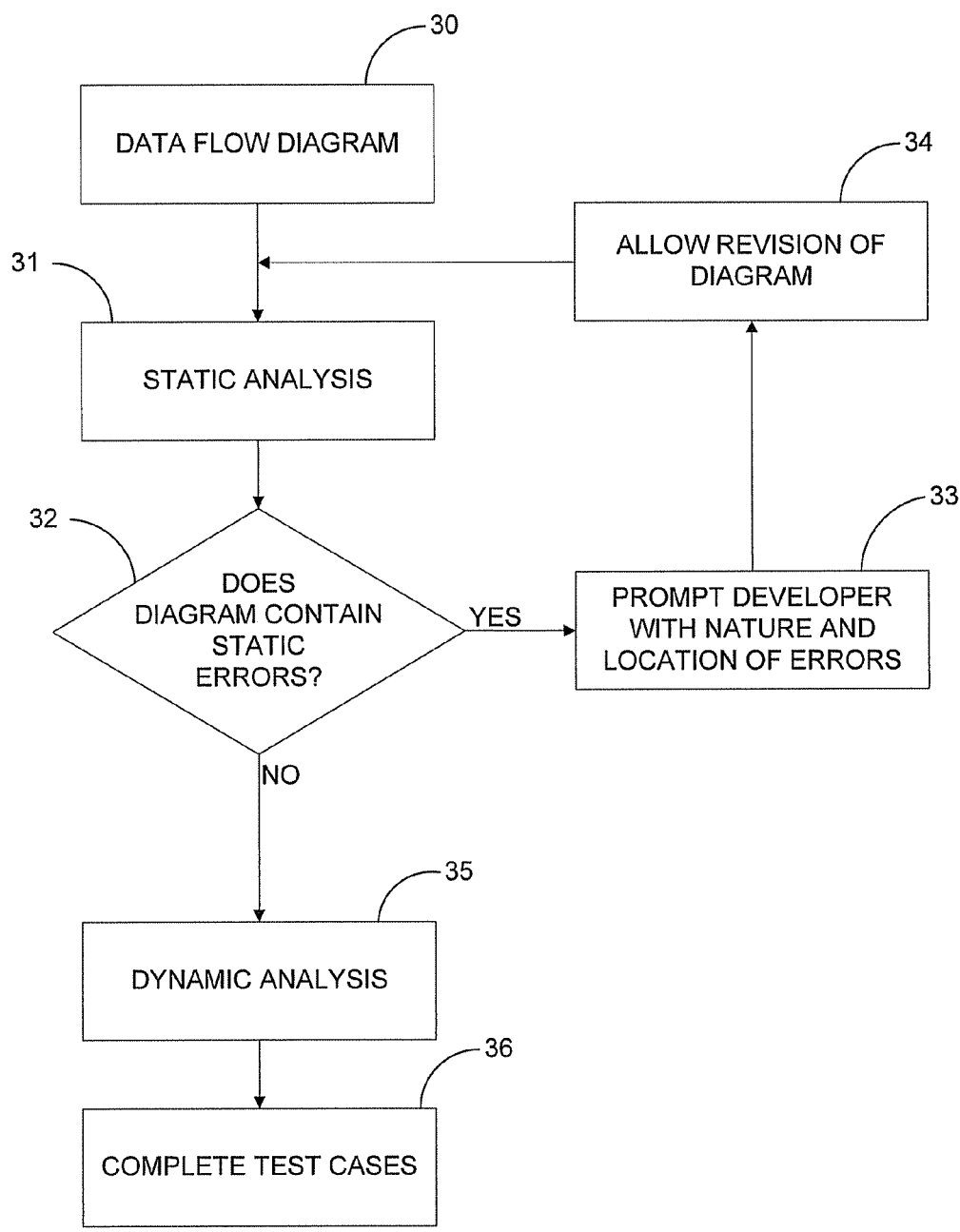
FIG. 3 is a flow diagram depicting the functions of an exemplary method.

A data flow diagram import module, which may be included with the test generator, reads the diagram information from its source (e.g., a file, database, or Matlab Simulink model) and brings it into the application in a form that is usable by the test generator. FIG. 3 shows the overall interaction between the different phases of analysis in one embodiment of the test generation process. After being imported, the diagram 30 is subjected to static analysis 31. Should the diagram contain static errors, at decision 32, the test generation process prompts the developer with information about those errors, prompt 33. The developer is then given the opportunity in step 34 to revise the diagram to fix the static errors before static analysis 31 is again performed. If the diagram does not contain static errors as determined by decision 32, the diagram can then be subjected to dynamic analysis 35. The output of the dynamic analysis is a set of complete test cases 36 for the model.

Figure 4:
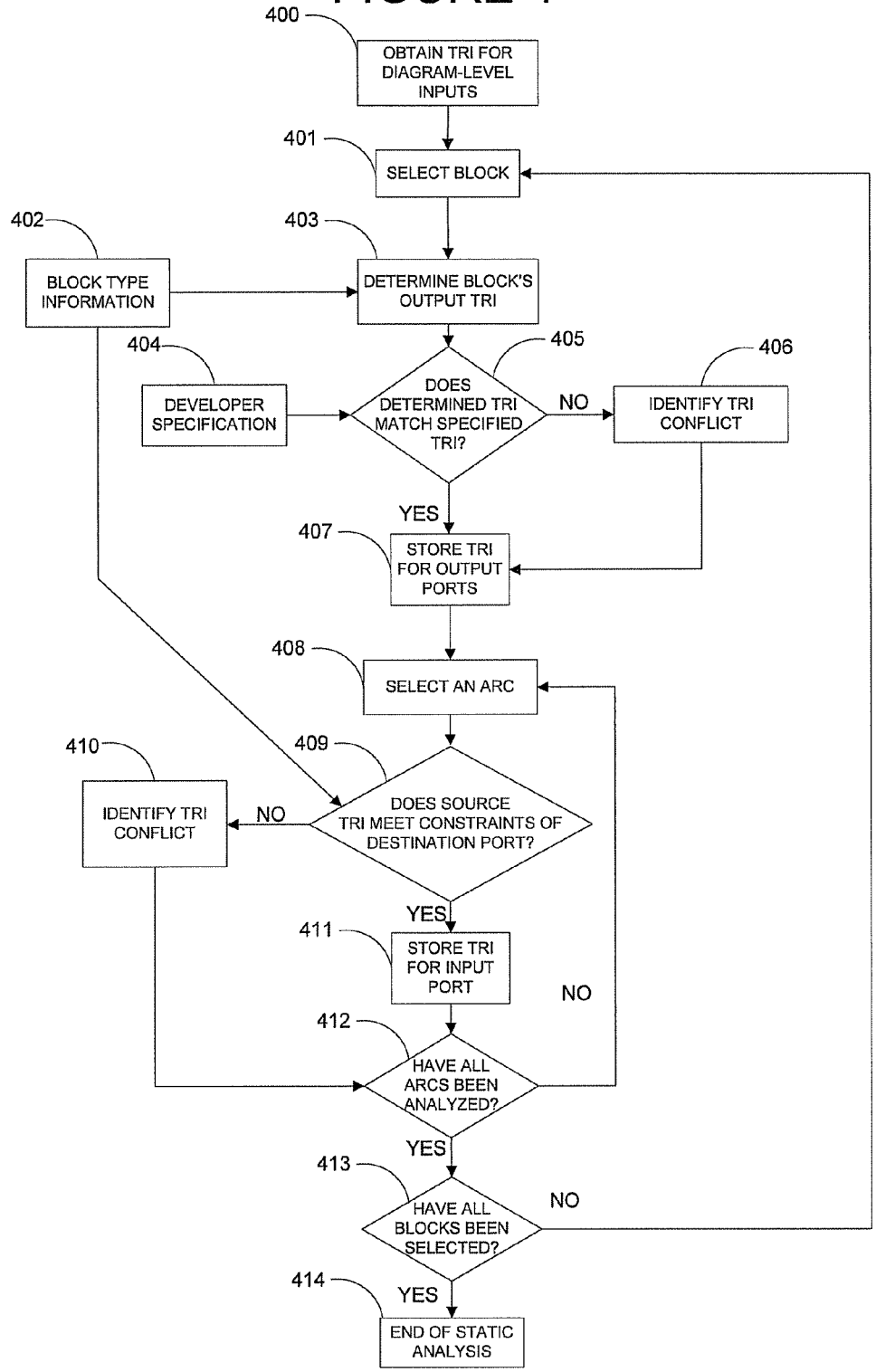
FIG. 4 is a flow diagram depicting the functions of the static analysis phase of an exemplary method.

FIG. 4 shows one embodiment of the static analysis phase of the test generation process. Each port in the diagram has data type and data range information (TRI) associated with it, which may be specified by the user or derived from another source, and in this embodiment, the test generator determines and confirms TRI for every port in the data flow block diagram. In step 400, the TRI for all the diagram-level input blocks is obtained, probably by being specified by the developer. In step 401, a block that has TRI information for all of its inputs is selected. For the first iteration of step 401, a block that directly uses diagram-level inputs would be chosen.

Using block type information 402 in step 403, the TRI for the block's output ports is determined based upon the functionality associated with the block type and upon TRI from the input ports propagated through the block. Propagation of ranges through certain high-level blocks may take advantage of a functional specification which establishes the relationship between the inputs and the outputs of the block. An example of such a high-level block with an attendant functional specification is a filter with its transfer function. Such a specification allows the derivation of range bounds on the output ports of a high-level block.

In addition to specifying diagram-level inputs, a developer may specify data type and range information for any arbitrary point in the diagram, and this information is a developer specification. If a developer specification 404 exists and contains any TRI for any of the output ports of the selected block, in decision 405, the TRI determined in step 403 is matched against the specified TRI. If the determined TRI does not match the specified TRI, a conflict is identified, and may be recorded, in step 406. If no conflict exists, the TRI for all of the block's output ports is stored in step 407.

In addition to describing the translation of block input TRI to block output TRI, block information 402 may also outline type and range constraints for the inputs of each block type. By comparing the stored TRI for a block output that is the source port of an arc to the input constraints on the destination port of the arc, the existence of type and range conflicts can then be determined. A type or range conflict exists if the TRI for the source port of an arc (the output port of a block) does not meet the constraints on the input at the destination port of the arc (the input port of another block). Whether the input constraints are met would be determined through the use of mathematical, set, and comparator operations collectively referred to as range comparisons. An example of a conflict would be an output TRI that includes the number zero being linked by an arc to a port on another block that corresponds to a mathematical divisor (that would not accept a zero value); the resultant range conflict would essentially be a divide-by-zero error. Because multiple arcs may leave from the same output port and connect to different input ports, a situation called fan-out, one output port may have multiple arcs to be checked for TRI conflicts.

Accordingly, an arc originating from one of the block's output ports is selected in step 408, and decision 409 determines whether the TRI of the arc's source port meets the input constraints of the arc's destination port. Those input constraints are determined using block information 402 regarding the block type of the block containing the destination port. If the output TRI does not meet the input constraints, a TRI conflict is identified in step 410. If no conflict exists, or after the conflict has been recorded, the TRI of the output source port is stored as the TRI of the destination input port in step 411. As the destination port most likely belongs to another block, step 411 allows TRI to be incrementally propagated from diagram-level inputs, through all intervening blocks, to diagram-level outputs.

In decision 412, it is determined whether all arcs associated with the selected block's output ports have been analyzed. If any arcs have not been analyzed, another arc is selected in step 408. If all arcs have been analyzed, in decision 413, it is determined whether all blocks have been selected. If any blocks have not been selected, another block is selected in step 401. If all blocks have been selected, static analysis ends in step 414.

An alternative embodiment of the static analysis phase calls for no range and type analysis. Instead, default TRI values for all of the ports in the diagram may be loaded for use during the dynamic analysis phase.

Test-Case Templates

The test cases for each block are derived from test case templates for its block type. A test case template for a block type describes a specific functional requirement of the block, and a template consists of a time sequence of values to be applied at block's input and expected values at block's outputs. Whereas a template describes values in terms of a block's inputs and outputs, a test case itself contains vectors of values for the diagram's inputs and outputs. The test generator uses the signal propagation specifications of other relevant blocks in the diagram to determine which values at the diagram's input would result in the values required by the test case template at the inputs of the block and what value should appear at a diagram output to reflect that the block produced the expected output value in the test case template.

The formal test requirements specifying how to test a particular block type are embodied in a set of test case templates, possible predefined, for that block type. Each test case template tests a specific function of the block and consists of a sequence of one or more template steps. The test case template orders in time the execution of the various template steps, and each template step denotes zero or more execution steps of the data flow block diagram. (A template step may correspond to zero execution steps when the execute count of the step, described below, is a formula that evaluates to zero, for example.) A template step describes a vector of values to be applied at the input ports of the block during some number of execution steps and expected values to be measured at the output ports of the diagram at the end of some number of execution steps.

Test case template values may be described numerically or by a formula. A formula is an expression using arithmetic or logical operators and basic terms that may refer to diagram-specific values, such as block properties, the TRI of the ports of a block, and diagram periodic rate.

In one embodiment, it is possible to add steps before and after the steps described in the test case template when creating a test case from it. The additions or deletions of steps would likely be performed by signal propagation specifications, described below, and would not alter a predefined template itself. Any insertion of new steps between the steps of a template could alter the template's meaning and thus may be allowed only if so indicated in the template. Like other template steps, added steps could be described in a formula language and executable over multiple time steps. In an alternative embodiment, the test case template may specify how many steps may be added, and where added steps may appear in the time sequence of template steps.

Each test case template can have a theoretically unlimited number of steps. Multiple steps that all specify the same set of input values can be compressed into a single step with an associated multiplier called an execute count. The execute count tells the algorithm how many times a particular step should be repeated before moving on to the next step, and it may be a defined numeric value or calculated from a formula. In these steps, the input values are assumed to be repeated for the specified execute count. Any output value specified in one of these steps is either available on the output port only at the end of the full execute count, or at every step, as specified in the template.

The behavior captured by the test case template may be described in literal terms with specific values or expressed as a formula. As is the case in the HiLiTE embodiment, the formula language may support the ability of a user to access all of the static, context-independent characteristics of the block type and the dynamic, context-sensitive characteristics of an individual block instance. Additionally, the formula language may support a user's ability to access TRI values computed during static analysis, such as the minimum value of the normal-operating range at an input of the block. A user may also access system information such as execution rate through the formula language.

Figure 5:
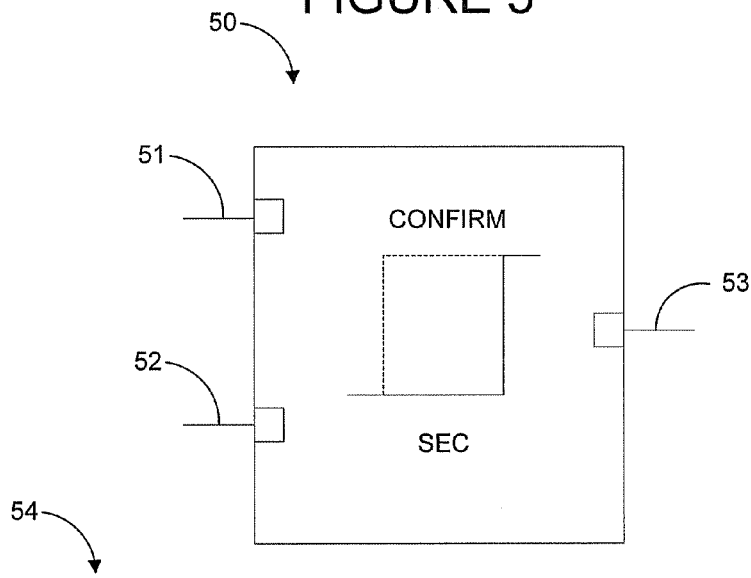
FIG. 5 is an exemplary representation of a block type template.

An example of a test case template is shown in FIG. 5. Example template 54 corresponds to block 50, which is of the same timer block type of block 28 in FIG. 2. Input 51 is "Confirm," input 52 is "TimeLimit," and output 53 is "Timeout." A test case for block 50 could be built by sequencing vectors corresponding to the steps 55, 56, 57, and 58. For example, the vector for step 55 would be a single time step, as it has an execute count of 1. At the beginning of that time step, 0 would be applied to input 51 and a value described by the formula OpRange.mid would be applied to input 52; 0 would be value expected at output 53 at the end of the time step.

The formula OpRange.mid denotes the midpoint of the normal-operating range of the TimeLimit port of the ConfirmSec block in this context, as computed during static analysis. The formula "(TimeLimit)(Rate)−1" takes the value specified in the template at the Time Limit port in this step, here OpRange.mid, and multiplies it by the Rate (the execution rate of the diagram, in Hertz), and subtracts one. The result of the formula is one less than the number of time steps at which the timer will expire. In this example, only step 56 corresponds to multiple vectors to be applied over the number of time steps dictated by the formula in the execute count field.

One block can have multiple test case templates associated with its block type, and each test case template is independent. Conditions can be attached to test case templates that can select the particular template based upon contextual conditions present for a particular block instance. Alternative test cases that test the same functionality can also be grouped such that the first test case template from that group that results in a generated test case causes the rest to be ignored.

Building test cases for execution across multiple time steps allows for the testing of time-varying functionality of a block. For blocks without any time-dependent behavior, a test case template typically includes only a single time step. The first time step of a template may be undefined, so that it could occur at any point during diagram execution, and the test generator could insert previous time steps if that becomes necessary during signal propagation. Alternatively, the first step of a template may correspond to a particular time after diagram execution begins.

Test case templates may be adapted to account for the variance among blocks of a particular block type. For example, given a block type with a varying number of identical inputs, such as a sum block, rather than force the manual specification of individual test case templates for blocks having different numbers of inputs, the preferred embodiment of the test generator may dynamically generate test cases, using a repetition directive in the template, based on the actual number of inputs an instance of that specific block type has.

Dynamic Analysis

The goal of the test generator is to generate tests for each block in a diagram in situ. It generates test cases for each block in the diagram (the block under test) in turn. The test case templates associated with the block's type already define the expected behavior for that block in terms of block inputs and outputs, but generating diagram-level test cases that test the block under test means determining diagram inputs that affect the block under test and expected diagram outputs affected by the block under test. Therefore, the test generator must determine what values can be applied to the input blocks of the diagram such that the values arriving at the inputs of the block under test are those desired by the current test case template step. Additionally, the test generator must determine expected values for the relevant diagram outputs that are directly traceable to the block outputs predicted by the same template step.

Figure 6:
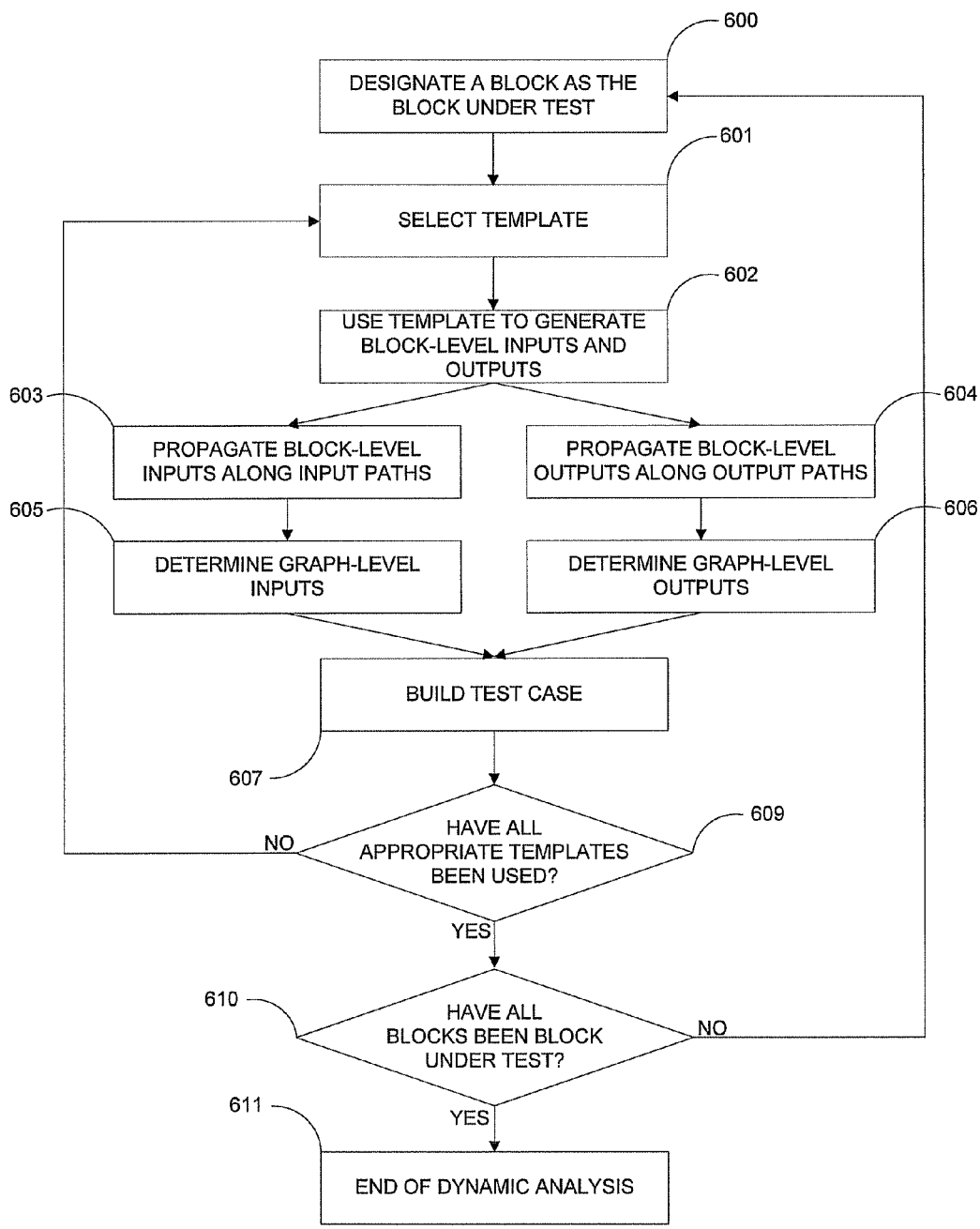
FIG. 6 is a flow diagram depicting the functions of the dynamic analysis phase of an exemplary method.

FIG. 6 depicts one embodiment of the dynamic analysis phase. In step 600, a block is designated as the block under test. In step 601, a test case template associated with the block type of the block under test is selected. In step 602, the selected test case template is used to determine the desired inputs and outputs of the block under test for each template step. These values or ranges are then propagated forward and backward through the diagram in steps 603 and 604. In step 603, the block-level inputs are propagated back along input paths of arcs and nodes to diagram inputs, and in step 605, diagram-level inputs are determined. In step 604, the block-level outputs are propagated forward along output paths of arcs and nodes, and in step 606, diagram-level outputs are determined.

During the propagation steps 603 and 604, at each block in the path, the value or range is adjusted to reflect how that value passes through that block. One way in which this pass-through can be determined is through a signal propagation specification such as those described below. When the propagated value or ranges extend to the diagram inputs and the diagram outputs, a test vector is assembled from those values. When test vectors have been created for all of the time steps specified by the selected test case template of the block under test, these test vectors can be assembled into a test case for the block under test in step 607. In decision 609, if all appropriate test case templates have not yet been selected, another template is selected in step 601. Some test case templates may not be appropriate for a particular embedding context, and that appropriateness analysis is included in decision 609. After all appropriate templates have been used for the block under test, it is determined, in decision 610, if each block has been the block under test. If any block has not yet been designated as the block under test, another block is designated in step 600. If all blocks in the diagram have been designated as the block under test, dynamic analysis ends in step 611.

In order to determine values to be applied to corresponding diagram inputs that will result in the desired value at a block under test's input port (as specified by a test case template), the test generator needs a specification of how to backward propagate this desired block input value through any intervening blocks to one or more diagram inputs. Similarly, the desired expected value at a block under test's output port must be forward propagated to a diagram output to be measured.

For each block type, the test generator has a specification (an Output-to-Input Propagation Specification) of how to determine input values that will result in a particular value at any chosen output port and a specification (an Input-to-Output Propagation Specification) of how to determine what additional inputs, if any, are needed to generate an output value that is directly attributable to a value at any chosen input. If the block type includes time-dependent behavior, the specification may time shift values ahead or behind the values input to the specification or include such time-shifted values with values for the original time step. In one embodiment, a specification may include multiple alternative ways to propagate a value through a block.

The values being propagated may be either point values or ranges. In fact, in one embodiment, the algorithm works only with ranges, and point values are simply represented as degenerate ranges. Additionally, ranges can be comprised of multiple, ordered, and even non-contiguous, subranges without changing the algorithm. The test generator can take advantage of fan-out and the resultant range intersection to refine or constrain its description of signal behavior through the diagram.

Before searching the diagram, the test generator starts from the block under test. The test case templates associated with that type of block are opened, and each applicable test case template is applied in turn. Applying a test case template involves applying each step of that template—evaluating the formulae for each input and output for that block type in the context of the block under test. This evaluation results in an initial set of port range pairs, which may form the basis of a Port Range Step List (PRSL), which may in turn form the basis of the diagram search. Once the initial PRSL has been created, the test generator then traverses each of the arcs from the ports of the block under test to their opposing endpoints, and from there it applies the appropriate propagation specification for the block newly encountered (the Output to Input Propagation Specification if it has arrived at an output port or the Input to Output Propagation Specification if it has arrived at an input port). The goal of the search is to determine the diagram-level inputs and outputs that correspond to the inputs and outputs specified for the block under test. These diagram-level inputs and outputs comprise the test cases.

Finding a set of diagram-level inputs and expected outputs associated with particular block-level inputs and outputs amounts to a search problem. In this search, the test generator looks for a set of (port, range) pairs that are consistent with the expected behavior of the block under test in the context of the current model during the current time period. Because the search might fail (due to such things as the failure of values being propagated from two different paths at a fan out point to intersect), the algorithm is designed to backtrack to a prior known viable state and try a different search alternative (a different set of (port, range) pairs). This backtracking requires that current state of the search be kept separate from the data flow block diagram itself. At each point in the search, the test generator chooses a (port, range) pair that has yet to be propagated, and propagates it forward if the target is diagram-level outputs or backwards if the target is diagram-level inputs. A Range State structure may keep track of both range information and other state information necessary to indicate the current progress through the search. The search terminates successfully when no pair is left un-propagated, that is, when diagram-level inputs and outputs are reached. The search would terminate unsuccessfully if all alternatives have been tried without finding a set of diagram-level inputs and outputs that correspond to a desired set of block-level inputs and outputs.

The search is conducted over the ports in the diagram over multiple time steps. The search may be aided by using constraint solving or iterative solving for a subdiagram of the overall data flow diagram when it can be clearly established during static analysis that such solving can fully enunciate the propagation alternatives for this subdiagram for signal propagation in and out of this sub diagram in relation to the rest of the diagram.

An equivalence class, one example of a propagation alternative, is the group of different input values that yield conceptually equivalent output values, and multiple equivalence classes may exist for each block type. For example, a range limiter block has a limited range of possible output despite having an unlimited range of possible inputs. A range limiter block has three equivalence classes: the set of all inputs that yield the minimum possible output value, the set of all inputs that pass through the block unchanged, and the set of all inputs that yield the maximum possible output. The maximum output value and minimum output value, as inputs, would each belong to two equivalence classes. Equivalence classes may also exist at the subdiagram level. These subdiagram-level equivalence classes may alleviate the need to use the signal propagation specifications of individual blocks within a subdiagram.

By shifting the time step of the test vectors forward or backwards, the test generator can account for signal propagation through feedback loops in the data flow block diagram. Such loops could also be dealt with by forward-propagating signals from the outputs of the feedback loop to the inputs of the same loop or by backwards-propagating signals from the inputs of the loop to the outputs of the loop. In general, a signal propagation specification for a time-dependent block can shift steps in time, add steps, or delete steps, as necessary.

The test generator can deal with fan-out points in the diagram as well. If the search algorithm is moving backwards through the diagram, and it reaches a fan-out in the diagram, it can propagate that output signal forward as a constraint on the remainder of the search. The output signal propagated forward would be defined by the intersecting ranges of the intersection of all of the ranges on input ports to which the output fans out.

Propagation along the arcs need only take into account fan-out range intersection as described above. Propagation through blocks, however, is not so simple. Propagation through blocks must take into account the different functionality of each block type. To handle this, Input-to-Output Propagation Specifications (for forward propagation) and Output-to-Input Propagation Specifications (for backwards propagation) are defined herein.

The semantics of each block type of a library can be captured by enumerating all equivalence classes of output-to-input and input-to-output propagation through the block. Reasoning at the block level—for filter, debounce, or latch functions, for example—can often yield more powerful equivalence classes in temporal logic or mathematical transfer functions than other test generators can create based on low-level subdiagrams. For example, numerical convergence over time of output to input can be established for a lag filter, based upon the knowledge of its transfer function. This can be used to establish range bounds for a search, which cannot be done by tools that do not account for the higher-level semantics of blocks. Similarly, in the time domain, the equivalence class for a latch can be defined non-deterministically: if the latch were "set" in some previous time step and has not been "reset" since, it must be "set" now. This is not apparent by looking at the subdiagram of the latch.

For each block type, the Input-to-Output Propagation Specification describes how to take a value or range at a block input port and determine what values (or ranges) must appear at the other input ports for that block, and when, in order to get a value on some output port of that block that is directly attributable to the specified input value. The result of applying this specification on a block input port is a set of desired inputs (including the originally specified value) and an expected passed-through value at an output port of the block. The passed-through value need not be the same as the original input value or in the same time step as the original input value; it need only be directly attributable to it. The implication is that if the actual measured output port value is equivalent to the expected value, then the actual value at the block input port must be the original input value, the value that was to be propagated forward. There may be multiple, alternative sets of inputs and outputs, with each set corresponding to one equivalence class, that can "pass through" the original input value in some form.

For each block type, the Output-to-Input Propagation Specification describes how to take a value/range at a block output port and determine what values (or ranges) can appear at the block input ports in order to make the original value appear at the specified output port. The result of applying this specification is a set of desired inputs, possibly ranging over multiple time steps. Because this specification exists only to ensure the proper values at the input ports of the block under test, there is no "attribution" element as exists in the input to output specification. There may be multiple, alternative sets of inputs that produce the desired output at the specified port.

In both these propagation specifications, the value at each port may be a range rather than a point value. If the value is a range, then any point value or subrange within that range can be used at that port. Additionally, though multiple propagation specifications could exist for any given block, only one of the alternative propagation specifications may need to be used in the search to produce a viable test case.

While there may be multiple alternative sets of inputs and outputs generated by one application of a propagation specification, the test generator may only use one set at any point in the search. Since the sets might not be equally useful, these multiple sets of propagation alternatives may be grouped or prioritized, and that prioritization may be based on equivalence classes. Such equivalence classes may allow the test generator to take advantage of lazy evaluation. Lazy evaluation means generating elements of a collection as needed, and it may be particularly useful if a given collection is large or infinite. In this context, lazy evaluation describes sequencing through different propagation alternatives from a set of propagation alternatives only until one alternative yields the desired result, and then proceeding with the search without evaluating any other alternatives. A set of equivalence classes for a particular block type may be described using a formula that can be evaluated dynamically when a new propagation alternative is needed. Thus, the test generator can examine each set, correspondingly recording the search space, until a set moves the search towards a search target. If the search encounters a dead-end, the search backtracks to a viable, as-yet-unsearched set and again proceeds. This is a depth-first search of the solution space.

Specifically, the search algorithm iteratively selects a portrange pair from the PRSL and computes the appropriate signal-propagation on the block attached to that port. The signal propagation returns a set of alternatives, with each alternative representing a branch in the search. The port-range pairs in each time step from a selected alternative are merged into the PRSL to yield a new PRSL, with the merge performing range intersection if a port appears in the PRSL as well as in the selected alternative. The search branch is abandoned in case of any range intersection failure. The search iteratively continues with the new PRSL. The selected alternative succeeds when the algorithm propagate values all the way through the diagram so that there is a continuous path from "injectable" inputs to "measurable" outputs. If some conflict occurs that prevents further progress, the algorithm backtracks to the last search branch and proceeds down an alternative branch using an alternative set from those described by the propagation specification. If all alternative sets from the last application of a propagation specification have been tried without success, then the test generator must backtrack to a previous propagation specification.

The propagation specifications may be implemented in multiple ways; however, in order for the test generator to apply the specifications mechanically, they should be readable by some type of specification interpreter. In the HiLiTE embodiment, most signal propagation specifications are written in the C# programming language that is compiled into Dynamically Linked Libraries. Another possible embodiment is to store the specifications as a set of rules, defined in a specialized language that can be evaluated by a rule interpreter provided with the implementation. In the evaluation of rules, special constructs of the rules language can result in function calls to C# code. Furthermore, the exact storage format and input mechanism of the specification can vary.

Exemplary embodiments of the present invention have been described above. Those skilled in the art will understand, however, that changes and modifications may be made to the embodiments described without departing from the true scope and spirit of the present invention, which is defined by the claims.

The invention claimed is:

1. A method for creating test cases, comprising:
   conducting a static analysis of a data flow diagram, wherein the data flow diagram embodies requirements and has at least one input and at least one output, wherein the data flow diagram is comprised of blocks, and wherein each block has at least one port describing either an input to or an output from the block;
   conducting a dynamic analysis of the data flow diagram by
   (a) designating a block as a block under test,
   (b) using a template to create at least one set of block input values to the block under test and at least one set of expected block output values from the block under test such that if the block input values are applied to the block under test and the expected block output values result, at least one requirement is verified,
   (c) propagating the block input values along input paths to determine corresponding data flow diagram input values, wherein an input path comprises a series of blocks and arcs that describe a data path from one or more inputs of the data flow diagram to the inputs of the block under test,
   (d) propagating the expected block output values along the output paths to determine corresponding data flow diagram expected output values, wherein an output path comprises a series of blocks and arcs describing a data path from the outputs of the block under test to one or more outputs of the data flow diagram,
   (e) combining the data flow diagram input values and the data flow diagram expected output values to create test vectors, and
   (f) repeating dynamic analysis with a different block under test as needed until all blocks in the data flow diagram have been designated as the block under test; and
   combining the test vectors into test cases.

2. The method of claim 1, wherein the data flow diagram is designed to execute repeatedly over multiple time steps and wherein the test cases include input values and output values over multiple time steps.

3. The method of claim 1, wherein a port has data type and range information, and wherein the static analysis comprises
comparing the data type and value range information of each pair of ports connected by an arc to identify type and range conflicts; and
generating an error message when a type or range conflict is identified.

4. The method of claim 3, wherein the static analysis further comprises prompting a user to resolve any type or range conflicts before conducting the dynamic analysis on the data flow diagram.

5. The method of claim 1, wherein static analysis comprises:
determining a maximum-possible range for each port in the data flow diagram by propagating maximum-allowable ranges throughout the data flow diagram;
determining a normal-operating range for each port in the data flow diagram by propagating the maximum-possible range of each port throughout the data flow diagram; and
limiting the normal-operating range of each port to that range which is shared by all of the inputs to which the port fans out; and wherein conducting dynamic analysis of the data flow diagram further comprises allowing the maximum-possible ranges to constrain the test vectors.

6. The method of claim 1, wherein propagating the block input values along the input paths to determine corresponding data flow diagram input values uses output-to-input propagation specifications for blocks along the input paths, and wherein propagating the expected block output values along the output paths to determine corresponding data flow diagram expected output values uses input-to-output propagation specifications for blocks along the output paths.

7. The method of claim 6, wherein the dynamic analysis further comprises propagating range information.

8. The method of claim 7, wherein propagating range information comprises:
determining a maximum-possible range for each port in the data flow diagram by propagating maximum-allowable ranges throughout the data flow diagram;
determining a normal-operating range for each port in the data flow diagram by propagating the maximum-possible range of each port throughout the data flow diagram;
limiting the normal-operating range of each port to that range which is shared by all of the inputs to which the port fans out; and
allowing the maximum-possible ranges to constrain the test vectors.

9. The method of claim 6, wherein the output-to-input propagation specifications generate input values that correspond to given output values, and wherein the input-to-output propagation specifications generate output values that are directly attributable to given input values.

10. The method of claim 6, wherein a signal propagation specification adds at least one time step of values to the values being propagated.

11. The method of claim 6, wherein a signal propagation specification shifts the time steps associated with propagated values.

12. The method of claim 1, wherein propagating the block input values along the input paths to determine corresponding data flow diagram input values includes using propagation alternatives for blocks along the input paths, and wherein propagating the expected block output values along the output paths to determine corresponding data flow diagram expected output values includes using propagation alternatives for blocks along the output paths.

13. The method of claim 12, wherein a lazy evaluation computation is used to choose from among the propagation alternatives associated with a block.

14. The method of claim 1, wherein the block under test has a block type that defines at least one function of the block under test, and wherein the template is associated with the block type of the block under test.

15. The method of claim 14, wherein the block under test has time-varying functionality and the template includes multiple, ordered time steps.

16. The method of claim 1, wherein a template may be defined by a developer using a formula language.

17. A method for creating test cases, comprising:
conducting a static analysis of a data flow diagram, wherein the data flow diagram embodies requirements and has at least one input and at least one output, wherein the data flow diagram is comprised of blocks, wherein each block has at least one port describing either an input to or an output from the block and having data type and value range information, and wherein the static analysis comprises
(i) comparing the data type and value range information of each pair of ports connected by an arc to identify type and range conflicts, and
(ii) analyzing the value range information of every port to identify design errors;
conducting a dynamic analysis of the data flow diagram by
(a) designating a block as a block under test,
(b) creating at least one set of data flow diagram input values and at least one set of expected data flow diagram output values such that if the data flow diagram input values are applied to the data flow diagram and the expected data flow diagram output values result, at least one requirement of the block under test is verified,
(c) combining the data flow diagram input values and the data flow diagram expected output values to create test vectors, and
(d) repeating dynamic analysis with a different block under test as needed until all blocks in the data flow diagram have been designated as the block under test; and
combining the test vectors into test cases.

18. The method of claim 17, wherein the static analysis further comprises:
generating an error message when a type conflict, range conflict, or divide-by-zero error is identified; and
prompting a user to resolve any type conflicts, range conflicts, or design errors before conducting the dynamic analysis on the data flow diagram.

19. The method of claim 17, wherein the static analysis further comprises:
determining a maximum-possible range for each port in the data flow diagram by propagating maximum-allowable ranges throughout the data flow diagram;
determining a normal-operating range for each port in the data flow diagram by propagating the maximum-possible range of each port throughout the data flow diagram;
limiting the normal-operating range of each port to that range which is shared by all of the inputs to which the port fans out; and allowing the maximum-possible ranges to constrain the test vectors.

20. A method for creating test cases, comprising:

conducting a static analysis of a data flow diagram, wherein the data flow diagram embodies requirements and has at least one input and at least one output, wherein the data flow diagram is comprised of blocks, wherein each block has at least one port describing either an input to or an output from the block and having data type and value range information, and wherein the static analysis includes
- (i) comparing the data type and value range information of each pair of ports connected by an arc to identify type and range conflicts,
- (ii) analyzing the value range information of every input port to identify design errors,
- (iii) generating an error message when a type conflict, range conflict, or design error is identified, and
- (iv) prompting a user to resolve any type conflicts, range conflicts, or divide-by-zero errors before conducting a dynamic analysis on the data flow diagram;

conducting the dynamic analysis of the data flow diagram by
- (a) designating a block as a block under test,
- (b) using a template to create at least one set of block input values to the block under test and at least one set of expected block output values from the block under test such that if the block input values are applied to the block under test and the expected block output values result, at least one requirement is verified,
- (c) propagating the block input values along input paths to determine corresponding data flow diagram input values using output-to-input propagation specifications for blocks along the input paths, wherein an input path comprises a series of blocks and arcs that describe a data path from one or more inputs of the data flow diagram to the inputs of the block under test, and
- (d) propagating the expected block output values along the output paths to determine corresponding data flow diagram expected output values using input-to-output propagation specifications for blocks along the output paths, wherein an output path comprises a series of blocks and arcs that describe a data path from the outputs of the block under test to one or more outputs of the data flow diagram,
- (e) combining the data flow diagram input values and the data flow diagram expected output values to create test vectors, and
- (f) repeating dynamic analysis with a different block under test as needed until all blocks in the data flow diagram have been designated as the block under test; and combining the test vectors into test cases.

* * * * *